(12) United States Patent
Cornil et al.

(10) Patent No.: US 8,298,381 B2
(45) Date of Patent: Oct. 30, 2012

(54) METHOD AND INSTALLATION FOR THE VACUUM COLOURING OF A METAL STRIP BY MEANS OF MAGNETRON SPUTTERING

(75) Inventors: Hugues Cornil, Marchin (BE); Benoit Deweer, Sterrebeek (BE); Claude Maboge, Castillon (BE); Jacques Mottoulle, Namur (BE)

(73) Assignee: Arcelormittal France, Saint Denis (FR)

( * ) Notice: Subject to any disclaimer, the term of this patent is extended or adjusted under 35 U.S.C. 154(b) by 774 days.

(21) Appl. No.: 12/092,707

(22) PCT Filed: Oct. 26, 2006

(86) PCT No.: PCT/FR2006/002414
§ 371 (c)(1),
(2), (4) Date: Jul. 17, 2009

(87) PCT Pub. No.: WO2007/051916
PCT Pub. Date: May 10, 2007

(65) Prior Publication Data
US 2010/0051448 A1    Mar. 4, 2010

(30) Foreign Application Priority Data
Nov. 7, 2005  (EP) .................................. 05292354

(51) Int. Cl.
*C23C 14/35* (2006.01)
*H01L 21/306* (2006.01)
(52) U.S. Cl. ......... 204/192.32; 204/298.31; 204/298.37; 156/345.46; 216/67; 216/70; 216/71
(58) Field of Classification Search ............. 204/192.32, 204/298.31, 298.37; 156/345.46; 216/67, 216/70, 71
See application file for complete search history.

(56) References Cited

U.S. PATENT DOCUMENTS

| 4,896,813 | A  | * | 1/1990 | Saijo et al. .................... 228/116 |
| 6,066,241 | A  | * | 5/2000 | Pierre et al. ............. 204/192.32 |
| 6,231,727 | B1 | * | 5/2001 | Vanden Brande et al. ....................... 204/192.32 |

FOREIGN PATENT DOCUMENTS

| EP | 0 878 565 | 11/1998 |
| JP | 09 125247 | 5/1997 |
| WO | 98 26108 | 6/1998 |

OTHER PUBLICATIONS

Machine Translation of JP 09-125247 dated May 1997.*

* cited by examiner

*Primary Examiner* — Rodney McDonald
(74) *Attorney, Agent, or Firm* — Oblon, Spivak, McClelland, Maier & Neustadt, L.L.P.

(57) ABSTRACT

A vacuum process for etching a metal strip running over a backing roll facing a counterelectrode by magnetron sputtering, and a vacuum chamber etching installation implementing the process. A plasma is created in a gas close to the metal strip so as to generate radicals and/or ions that act on the strip, and at least one closed magnetic circuit, the width of which is approximately equal to that of the metal strip, is selected from a series of at least two closed magnetic circuits of different and fixed widths, then the selected magnetic circuit is positioned so as to face the metal strip, and then the etching of the moving metal strip is carried out.

19 Claims, 1 Drawing Sheet

Figure 1:
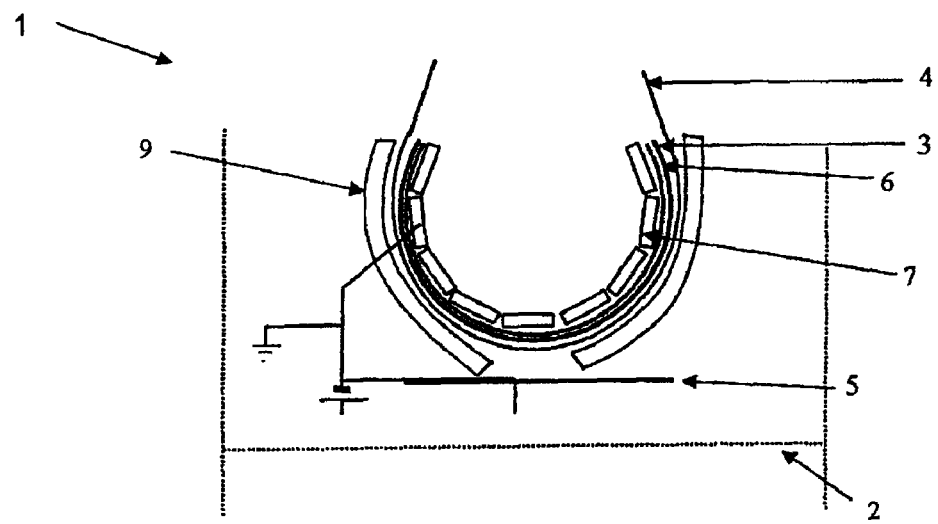

METHOD AND INSTALLATION FOR THE VACUUM COLOURING OF A METAL STRIP BY MEANS OF MAGNETRON SPUTTERING

The present invention relates to a vacuum process and installation for etching a metal strip, such as for example a steel strip, by magnetron sputtering.

During operations of vacuum coating a steel strip, the state of cleanliness of the strip before deposition is one of the key success factors, and it determines the good adhesion of the coating to be deposited. One of the processes used to do this is vacuum etching by magnetron sputtering, also called sputter etching. This process consists in creating, between the strip and a counterelectrode, a plasma in a gas that makes it possible to generate radicals and/or ions. These ions are, under normal operating conditions, accelerated toward the surface of the strip to be etched and tear off surface atoms, thus cleaning the possibly soiled surface, while activating it.

The strip to be etched runs through a vacuum chamber facing a counterelectrode. The latter is biased positively with respect to the substrate, which is itself preferably grounded. An array of magnets positioned behind the strip confines the plasma created close to it. For very precise positioning of the metal strip to be treated, with respect to the counterelectrode needed for implementing the magnetron sputtering, the metal strip is generally placed on a backing roll that can be rotated about its axis.

To implement this type of surface treatment on an industrial scale imposes additional constraints on the process. In particular, it is necessary to be able to adapt the width of the etched surface to the width of the steel strip, which may vary over the course of time. Such adaptation means that the action of the radicals or ions generated in the plasma have to be limited to the zone bounded by the metal strip to be etched.

For this purpose, patent EP-A-0 603 587 discloses an installation for uniformly eroding a substrate by means of a plasma. This installation allows the etching zone to be displaced over short lengths without correspondingly changing its dimension in any direction. This makes the erosion of the substrate more uniform, but does not allow it to be actually adapted to a variation in width of the strip to be treated.

Also known is EP-A-0 878 565, which discloses several installations aimed at solving this problem of the variation in width of a substrate to be treated by etching. A first device shown in FIGS. 4 and 5 employs a magnetic circuit made up of three individual circuits of the same width. The central circuit is stationary and other two circuits may move laterally with respect to the strip so as to adapt the width of the total magnetic circuit to the width of the strip. When the strip is not positioned on a roll or rests on a nonconducting roll, it is difficult to ignite a plasma racetrack extending partly over the strip and partly over an insulating surface. This is because the edges tend to create a nonuniform electric field (tip effect) and a racetrack intersected at this point results in the occurrence of many arcs when it is desired to ramp up the power. The device therefore operates only when the lateral magnetic circuits are not facing the steel strip or are completely facing it. However, in the latter case, the etching is not uniform since the areas on which the magnetic circuit act overlap so as to adapt to the width of the strip.

When the strip is positioned on a conducting roll, the device cannot operate without eroding the roll continuously and substantially, requiring it to be frequently replaced.

Figure 2:
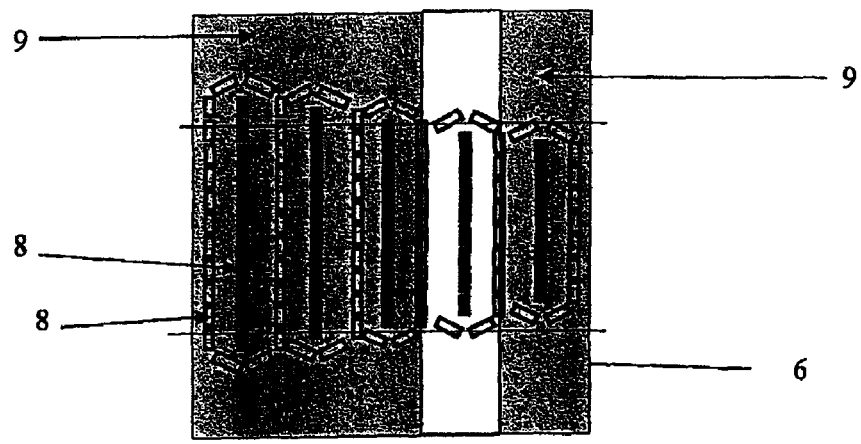

This document discloses a second device, shown in FIGS. 1 to 3, employing a magnetic circuit consisting of permanent magnets in the form of a rectangular frame 3 (North pole) and permanent magnets formed from three successive parallel bars 4 (South pole), or vice versa. The central bar 4a of the South pole like the longitudinal sides 3a of the frame 3 forming the North pole are stationary. The end sides 3b of the frame 3 and the bars 4b of the South pole can slide together in the transverse direction with respect to the direction of movement of the strip. When the strip is not positioned on a roll or rests on a nonconducting roll, a problem again arises at the edges. Arcs appear when the magnetic circuit extends slightly beyond the edge of the strip so as for this part to be correctly etched. In addition, the etching is inhomogeneous when the areas of action of the magnets 4 overlap so as to adapt to the width of the strip.

Moreover, when the strip is positioned on a conducting roll, the etching is again nonuniform when the areas of action of the magnets 4 overlap. Furthermore, when the strip is narrow, the North magnets 3a not facing the surface to be treated also disturb the magnetic field.

This document also discloses a third device, shown in FIG. 6, employing a magnet circuit of multicellular structure. This structure consists of a succession of independent magnetic circuits 2', 2'', etc. lying in successive rows 12, 12'. If the strip is not positioned on a cylindrical roll or rests on a nonconducting roll, the installation operates but leads to the formation of arcs at the magnetic circuits intersecting the strip edge. If the strip is positioned on a conducting roll, the installation no longer allows the etched width to be adapted to various substrate widths.

The object of the present invention is therefore to remedy the drawbacks of the processes of the prior art by providing a vacuum process and installation for etching the surface of a metal strip running over a backing roll by magnetron sputtering, which allows the treatment to be adapted to a variation in width of the strip, while still treating the entire surface uniformly and without damaging the backing roll.

For this purpose, the first subject of the invention is a vacuum process for etching a metal strip running over a backing roll facing a counterelectrode by magnetron sputtering in a vacuum chamber in which a plasma is created in a gas close to said metal strip so as to generate radicals and/or ions that act on this strip, characterized in that at least one closed magnetic circuit, the width of which is approximately equal to that of said metal strip, is selected from a series of at least two closed magnetic circuits of different and fixed widths, then said selected magnetic circuit is positioned so as to face said metal strip and then the etching of said moving metal strip is carried out.

The process according to the invention may furthermore incorporate the following features, taken in isolation or in combination:
  the backing roll is a conducting roll;
  the closed magnetic circuit or circuits comprise rows of magnets arranged edge to edge, two successive rows having opposed polarities;
  the selected magnetic circuit or circuits generate a magnetic field tangential to the metal strip with an intensity greater than 300 gauss;
  the magnetic circuit or circuits are placed on the outer surface of a cylindrical support placed inside the backing roll concentrically with respect to the roll, the cylindrical support being able to rotate about this axis;
  the magnetic circuit or circuits are placed on a yoke made of mild steel;
  the magnetic circuit or circuits are ordered in increasing size toward the surface of the cylindrical support;

the magnetic circuits that are not selected are blanked off by a neutralizing device that does not let a magnetic field of greater than 100 gauss pass from said magnetic circuits to the metal strip;

the neutralizing device is made in two parts that are positioned on either side of said magnetic circuit or circuits, defining an etching window;

a first coil of metal strip having a constant width L1 and then a second coil of constant width L2 are treated, the first coil being treated by means of a closed magnetic circuit of width L1 which is brought above said strip, and then said circuit is removed so as to replace it by a second circuit of width L2 with which said second coil of metal strip having a constant width L2 is treated;

the etched metal strip is then vacuum-coated with a protective coating; and the metal strip is a steel strip.

A second subject of the invention consists of a vacuum installation for etching a metal strip by magnetron sputtering, comprising a backing roll facing a counterelectrode, means for biasing said metal strip, means for creating a plasma in a gas between said strip and said counterelectrode, a series of at least two closed magnetic circuits of different fixed widths, each capable of individually treating the entire width of a metal strip, and means for positioning one or more of said magnetic circuits facing said metal strip.

The installation according to the invention may furthermore incorporate the following features, taken in isolation or in combination:

the backing roll is a conducting roll;

the closed magnetic circuit or circuits comprise rows of magnets arranged edge to edge, two successive rows having opposed polarities;

the magnetic circuit or circuits may generate a magnetic field tangential to the metal strip with an intensity greater than 300 gauss;

the magnetic circuit or circuits are placed on the outer surface of a cylindrical support placed inside the backing roll concentrically with respect to the roll, the cylindrical support being able to rotate about this axis;

the magnetic circuit or circuits are placed on a yoke made of mild steel;

the magnetic circuit or circuits are ordered in increasing size toward the surface of the cylindrical support;

the installation further includes a neutralizing device that does not let a magnetic field of greater than 100 gauss pass from the magnetic circuits to the metal strip; and the neutralizing installation is made in two parts that can be positioned on either side of said magnetic circuit or circuits, between the metal strip and the counterelectrode.

The invention will now be described in greater detail with reference to the appended figures which represent:

FIG. 1: a schematic sectional view of one embodiment of an installation according to the invention; and FIG. 2: a schematic top view of part of the installation of FIG. 1.

Firstly with regard to FIG. 1, this shows an installation 1 according to the invention comprising a vacuum chamber 2 in which a backing roll 3 having a cylindrical surface and being able to rotate about an axis is mounted. A steel strip 4 to be etched is wound around this roll 3 facing a counterelectrode 5. The latter is positively biased with respect to the steel strip, which is itself preferably grounded.

The counterelectrode system may consist of one or more electrodes and take various forms, such as for example a wire.

A drum-shaped support 6 accommodating within it a number of magnetic circuits 7 is mounted inside the roll 3. The backing roll 3 must be of sufficient diameter to accommodate within it the appropriate number of magnetic tracks 7 for being able to adapt to all of the intended widths within the manufacturing range.

Since the roll 3 is continually eroded by the plasma that extends beyond the edges of the strip 4, the table for the roll must therefore be considered as a wear part. The roll 3 must be able to be easily rectified and the table easily replaced at the end of life. This lifetime depends on the surface sputter rate. By choosing any conductive coating having a lower erosion rate it is possible to improve its lifetime.

The roll 3 may optionally be connected to ground and is preferably conducting. As a result, this embodiment makes it possible to limit, or even prevent, the appearance of arcs on the edges of the strip during etching, something which could make the treatment nonuniform between the center of the strip and its edges.

The drum 6 may be rotated inside the backing roll 3 during production. This drum 6 must be of sufficient diameter to accommodate the appropriate number of magnetic tracks 7 for adapting to all the intended widths within the manufacturing range.

As may be seen in FIG. 2, the magnetic circuits 7 are of different width, increasing in the direction transverse to the direction in which the steel strip 4 runs.

Each magnetic circuit 7 consists of magnets 8 that can be mounted on parts made of mild steel. These parts may either be independent elements attached to the drum, or a shell serving as cradle.

Advantageously, a mild steel yoke beneath the magnets 8 is used to increase the induced field above the magnetron arrangement and prevents the field lines from disappearing far behind the magnets 8.

The magnets 8 are arranged so as to form at least one closed magnetic track in which the field tangential to the strip is greater than 300 gauss and preferably greater than 500 gauss.

The magnets 8 of any one row are preferably placed edge to edge so as to avoid rectangular field distortions that would reduce the effectiveness of the confinement.

Moreover, as may be seen in FIG. 1, neutralizing masks 9 surround the entire backing roll 3 except for the active part in the etching window. The masks 9 may be made of nonferromagnetic material and may either be solid or else hollow, but closed. The thickness of these masks 9 is such that the magnetic field emanating from them is less than 100 gauss and advantageously less than 50 gauss, so as to avoid any igniting of a plasma outside the etching zone.

The operation of the installation according to the invention will now be described. When it is desired to etch the metal strip 4, which may be made of steel, aluminum, copper, etc., it is biased, for example negatively, and made to run through the vacuum chamber 2. A plasma is ignited in this chamber 2 between the positively biased counterelectrode and the strip 4. The strip 4 is etched by the bombardment of ions and/or radicals thereon.

By rotating the drum 6, the magnetic circuit or circuits 7 of desired width are selected and positioned facing the counterelectrode 5. The magnetic field neutralizing masks 9 are positioned on either side of the magnetic circuit or circuits 7 so as to adjust the etching window to the precise dimensions of the running strip 4. When there is a change in width of the strip 4, all that is required is to rotate the drum 6 so as to position the magnetic circuit 7 of appropriate width facing the counterelectrode.

It therefore may be seen that the installation and the process according to the invention make it possible to treat a metal strip of variable width in an effective and simple manner, treating it uniformly over its entire surface, including the edges, without generating electric arcs and without damaging the backing roll, which does not undergo etching.

Moreover, it is also possible to use the installation according to the invention to treat successive coils of metal strip of constant width but in which the thickness differs from one coil to another. Thus, if a first coil of strip of constant width L1 and then a second coil of strip of constant width L2 have to be treated, a first magnetic circuit 7 of width L1 is firstly placed above the strip 4 and the entire first coil is treated without modifying the installation. Next, the drum 6 is rotated in such a way that a second magnetic circuit 7 of width L2 faces the path of the strip 4 and the second coil of width L2 is treated after the masks 9 have been positioned so as to neutralize the other, nonselected, circuits 7. Depending on the manufacturing range of the industrial line, it is thus possible advantageously to provide a drum 6 provided with as many magnetic circuits 7 as there are strip widths within this manufacturing range.

The invention claimed is:

1. A vacuum process for etching a metal strip running over a backing roll facing a counterelectrode by magnetron sputtering in a vacuum chamber, comprising:
   creating a plasma in a gas close to the metal strip so as to generate radicals and/or ions that act on the strip;
   selecting at least one closed magnetic circuit, the width of which is approximately equal to that of the metal strip, from a series of at least two closed magnetic circuits of different and fixed widths;
   positioning the selected magnetic circuit so as to face the metal strip; and
   etching the moving metal strip,
   wherein the at least one magnetic circuit is placed on an outer surface of a cylindrical support placed inside the backing roll concentrically with respect to the backing roll, the cylindrical support being able to rotate about an axis of the cylindrical support.

2. The process as claimed in claim 1, wherein the backing roll is a conducting roll.

3. The process as claimed in claim 1, wherein the at least one closed magnetic circuit comprises rows of magnets arranged edge to edge, two successive rows having opposed polarities.

4. The process as claimed in claim 1, wherein the selected at least one magnetic circuit generates a magnetic field tangential to the metal strip with an intensity greater than 300 gauss.

5. The process as claimed in claim 1, wherein the at least one magnetic circuit is placed on a yoke made of mild steel.

6. The process as claimed in claim 1, wherein
   the at least one magnetic circuit consists of a plurality of magnetic circuits, and
   the plurality of magnetic circuits are ordered in increasing size toward the surface of the cylindrical support.

7. The process as claimed in claim 1, wherein the magnetic circuits that are not selected are blanked off by a neutralizing device that does not let a magnetic field of greater than 100 gauss pass from the magnetic circuits to the metal strip.

8. The process as claimed in claim 7, wherein the neutralizing device includes two parts that are positioned on either side of the at least one magnetic circuit, defining an etching window.

9. The process as claimed in claim 1, wherein a first coil of metal strip having a constant width L1 and a second coil of constant width L2 are treated, the first coil being treated by a closed magnetic circuit of width L1 that is brought above the strip, and then the circuit is removed so as to be replaced by a second circuit of width L2 with which the second coil of metal strip having a constant width L2 is treated.

10. The process as claimed in claim 1, wherein the metal strip is a steel strip.

11. The process as claimed in claim 1, wherein the etched metal strip is then vacuum-coated with a protective coating.

12. A vacuum installation for etching a metal strip by magnetron sputtering, comprising:
   a backing roll facing a counterelectrode;
   means for biasing the metal strip;
   means for creating a plasma in a gas between the metal strip and the counterelectrode;
   a series of at least two closed magnetic circuits of different fixed widths, each capable of individually treating an entire width of a metal strip; and
   means for positioning at least one of the magnetic circuits facing the metal strip,
   wherein the at least one magnetic circuit is placed on an outer surface of a cylindrical support placed inside the backing roll concentrically with respect to the roll, the cylindrical support being able to rotate about an axis of the cylindrical support.

13. The installation as claimed in claim 12, wherein the backing roll is a conducting roll.

14. The installation as claimed in claim 12, wherein the at least one magnetic circuit comprise rows of magnets arranged edge to edge, two successive rows having opposed polarities.

15. The installation as claimed in claim 12, wherein the at least one magnetic circuit generates a magnetic field tangential to the metal strip with an intensity greater than 300 gauss.

16. The installation as claimed in claim 12, wherein the at least one magnetic circuit is placed on a yoke made of mild steel.

17. The installation as claimed in claim 12, wherein
   the at least one magnetic circuit consists of a plurality of magnetic circuits, and
   the plurality of magnetic circuits are ordered in increasing size toward the surface of the cylindrical support.

18. The installation as claimed in claim 12, further comprising:
   a neutralizing device that does not let a magnetic field of greater than 100 gauss pass from the magnetic circuits to the metal strip.

19. The installation as claimed in claim 18, wherein the neutralizing device includes two parts that can be positioned on either side of the at least one magnetic circuit, between the metal strip and the counterelectrode.

* * * * *